(12) United States Patent
Swoboda et al.

(10) Patent No.: US 12,385,976 B2
(45) Date of Patent: Aug. 12, 2025

(54) DIAGNOSTIC CIRCUIT FOR A BATTERY DISCONNECT UNIT, METHOD FOR DIAGNOSING A BATTERY DISCONNECT UNIT, BATTERY DISCONNECT UNIT

(71) Applicant: Robert Bosch GmbH, Stuttgart (DE)

(72) Inventors: Johannes Swoboda, Stuttgart (DE); Chrysanthos Tzivanopoulos, Grossbettlingen (DE); Thomas Barabas, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 145 days.

(21) Appl. No.: 18/159,537

(22) Filed: Jan. 25, 2023

(65) Prior Publication Data

US 2023/0236248 A1 Jul. 27, 2023

(30) Foreign Application Priority Data

Jan. 26, 2022 (DE) ...................... 10 2022 200 872.3

(51) Int. Cl.
  *G01R 31/327* (2006.01)
  *B60L 58/10* (2019.01)
  *H01M 10/42* (2006.01)

(52) U.S. Cl.
  CPC ...... *G01R 31/3277* (2013.01); *H01M 10/425* (2013.01); *B60L 58/10* (2019.02); *H01M 2010/4271* (2013.01); *H01M 2220/20* (2013.01)

(58) Field of Classification Search
  CPC ........... G01R 31/3277; G01R 31/3278; H01M 10/425; H01M 2010/4271; H01M 2220/20; B60L 58/10; B60L 2240/54; B60L 2240/547; B60L 3/0046; B60L 3/04
  See application file for complete search history.

(56) References Cited

U.S. PATENT DOCUMENTS

| 11,515,719 | B2 * | 11/2022 | Kim | G01R 31/3277 |
| 2010/0244847 | A1 * | 9/2010 | Kudo | G01R 31/3842 |
| | | | | 324/433 |
| 2015/0346257 | A1 * | 12/2015 | Tabatowski-Bush | B60L 3/0023 |
| | | | | 324/503 |
| 2018/0188326 | A1 * | 7/2018 | Huh | G01R 19/16542 |
| 2018/0226963 | A1 * | 8/2018 | Asam | H03K 17/165 |

(Continued)

FOREIGN PATENT DOCUMENTS

| DE | 102016107274 A1 | 11/2016 |
| DE | 112017006265 T5 | 9/2019 |
| DE | 102020104110 A1 | 8/2021 |

*Primary Examiner* — Akm Zakaria
(74) *Attorney, Agent, or Firm* — Michael Best & Friedrich LLP

(57) ABSTRACT

A diagnostic circuit (60) for diagnosing a battery disconnect unit (100) for disconnecting a battery system (200) from an electrical system (300). The battery disconnect unit (100) includes a first switching element (S1) and a second switching element (S2). A first connection of the first switching element (S1) is connected to a first node point (8), and a second connection of the first switching element (S1) is connected to the first terminal (2). A first connection of the second switching element (S2) is connected to the first node point (8), and a second connection of the second switching element (S2) is connected to the second terminal (4). The diagnostic circuit (60) includes a first voltage divider (61) and a second voltage divider (62).

10 Claims, 1 Drawing Sheet

(56) References Cited

U.S. PATENT DOCUMENTS

2019/0181490 A1* 6/2019 Schlanger ............ H01M 10/486
2020/0217893 A1* 7/2020 Song ..................... H01M 10/48
2021/0231707 A1* 7/2021 Ock ...................... H01M 10/44

* cited by examiner

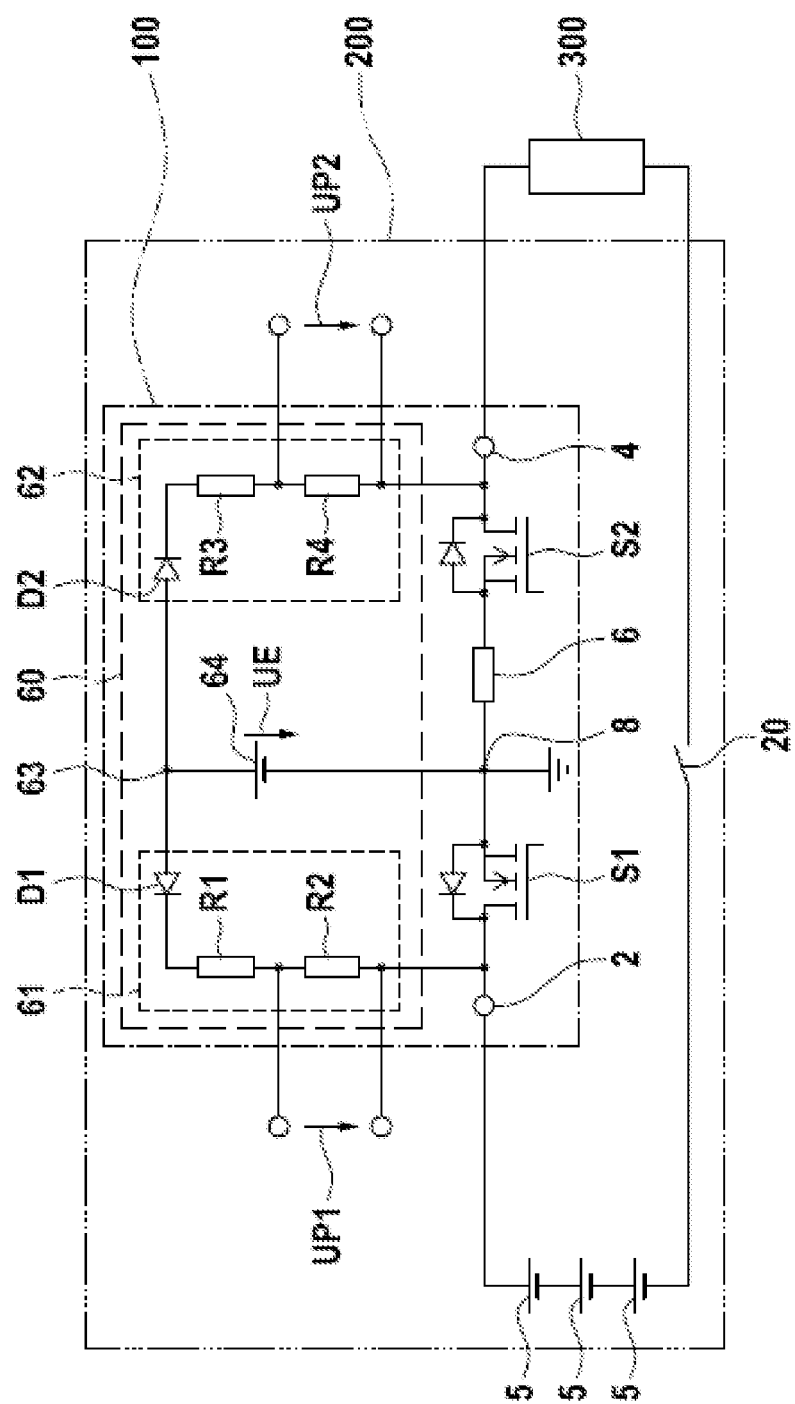

DIAGNOSTIC CIRCUIT FOR A BATTERY DISCONNECT UNIT, METHOD FOR DIAGNOSING A BATTERY DISCONNECT UNIT, BATTERY DISCONNECT UNIT

BACKGROUND OF THE INVENTION

The invention relates to a diagnostic circuit for diagnosing a battery disconnect unit for disconnecting a battery system from an electrical system. The battery disconnect unit comprises a first switching element and a second switching element. A first connection of the first switching element is connected to a first node point, and a second connection of the first switching element is connected to the first terminal. A first connection of the second switching element is connected to the first node point, and a second connection of the second switching element is connected to the second terminal.

The invention further relates to a method for diagnosing the battery disconnect unit by means of the diagnostic circuit according to the invention.

The invention also relates to a battery disconnect unit and a battery system.

Electric vehicles (EVs), hybrid electric vehicles (HEVs), and plug-in HEVs use one or more drive systems to provide driving force. The drive systems include an electrical system that receives power from power sources, such as a power grid, for charging a battery, drives an engine in order to move the vehicle, and supplies power to accessories in order to perform functions, such as lighting, and a battery pack that stores electrical power in a chemical manner in order to operate the vehicle in the future. In some circumstances, it may be desirable to disconnect the electrical system from the battery pack.

It is known that for switching a battery system on and off, e.g., in electric vehicles, so-called battery disconnect units (BDUs) are installed into the battery systems. Essential components of the BDUs are a switching device for electrically switching battery systems on and/or off. Such switching devices are installed in the positive and/or negative pole path of the battery system.

It is safety-relevant that a battery disconnect unit is faultless. Thus, it is necessary to check the functionalities of the battery disconnect unit regularly. A diagnostic circuit or diagnostic device is used in this respect.

Document DE 11 2017 006 265 T5 describes a battery unit and a power system. A battery disconnect unit comprising a plurality of controllable semiconductor switches is used. A diagnosis of the control signals is performed.

Document EN 10 2016 107 274 A1 relates to a switching device having a first switch and a second switch. The switching device comprises an evaluation circuit, which is configured to evaluate a temporal behavior of a node between the first switch and the second switch for identifying a possible error state of at least one of the first and the second switch.

SUMMARY OF THE INVENTION

A diagnostic circuit for diagnosing a battery disconnect unit for disconnecting a battery system from an electrical system is proposed. An electrical system is understood to mean a system comprising at least one electrical consumer and/or at least one electrical energy source. An electrical system in the sense of the invention may, for example, be designed as a charger for a battery system or as an on-board power supply of a vehicle. The battery disconnect unit comprises a first terminal, a second terminal, a first switching element and a second switching element. The switching elements each comprise three connections, wherein a switching path is formed between a first connection and a second connection and can be actuated by means of a third connection.

A first connection of the first switching element is connected to a first node point, and a second connection of the first switching element is connected to the first terminal. A first connection of the second switching element is connected to the first node point, and a second connection of the second switching element is connected to the second terminal.

According to the invention, the diagnostic circuit comprises a first voltage divider comprising a first resistor, a second resistor and a first protective diode, and a second voltage divider comprising a third resistor, a fourth resistor and a second protective diode. In this case, the first resistor, the second resistor and the first protective diode are connected in series such that the anode of the first protective diode is connected to a second node point, the cathode of the first protective diode is connected to a first connection of the first resistor, a second connection of the first resistor is connected to a first connection of the second resistor, and a second connection of the second resistor is connectable to one of the second connection of the first switching element and of the second connection of the second switching element. The third resistor, the fourth resistor and the second protective diode are connected in series such that the anode of the second protective diode is connected to a second node point, the cathode of the second protective diode is connected to a first connection of the third resistor, a second connection of the third resistor is connected to a first connection of the fourth resistor, and a second connection of the fourth resistor is connectable to one of the second connection of the first switching element and of the second connection of the second switching element.

According to a preferred embodiment of the invention, the first and the second voltage divider have an identical resistance ratio. The resistance ratio of the first voltage divider corresponds to a ratio of the first resistor to the second resistor. The resistance ratio of the second voltage divider corresponds to a ratio of the third resistor to the fourth resistor. For example, the first, the second, the third and the fourth resistor may have an identical resistance value.

Alternatively, a resistance ratio of the first voltage divider may deviate from a resistance ratio of the second voltage divider.

Preferably, the diagnostic circuit according to the invention further comprises a DC voltage source, which generates a DC voltage between the first and the second node point during diagnostics. Compared to the voltage at the second connections of the respective switching elements, the DC voltage source applies a negative voltage to the first node point during the diagnostics. The DC voltage source generates a voltage difference between the second connection of the respective switching elements and the first connection of the respective switching elements. For example, the DC voltage source may have a voltage of 30 V. It is also conceivable, however, for the DC voltage source to have a voltage of other values. The DC voltage source may be designed as a battery cell. A positive pole of the DC voltage source is connected to the second node point. A negative pole of the DC voltage source is connectable to the first node point and connected to the first node point during diagnostics. Alternatively, the DC voltage source may also be designed as a DC voltage transformer that can convert a DC voltage of an external DC voltage source from a different voltage level to a suitable voltage level for the diagnostics. However, a rectifier that converts an AC voltage into a DC voltage may also be regarded as a DC voltage source.

Another aspect of the invention is to provide a method for diagnosing a battery disconnect unit for disconnecting a battery system from an electrical system. The battery disconnect unit comprises a first terminal, a second terminal, a first switching element and a second switching element. A first connection of the first switching element is connected to a first node point, while a second connection of the first switching element is connected to the first terminal. A first connection of the second switching element is connected to the first node point, and a second connection of the second switching element is connected to the second terminal.

The method according to the invention is performed by means of the diagnostic circuit according to the invention. Accordingly, features described in the context of the diagnostic circuit apply to the method and vice versa, features described in the context of the method apply to the diagnostic circuit.

The method according to the invention comprises the following steps:
  connecting the second connection of the second resistor to one of the second connection of the first switching element and of the second connection of the second switching element;
  connecting the second connection of the fourth resistor to the other of the second connection of the first switching element and of the second connection of the second switching element;
  generating a DC voltage between the first and the second node point by means of the DC voltage source, while the first and the second switching element are in the open state;
  detecting a first measured value of the voltage drop at the second resistor;
  sensing a second measured value of the voltage drop at the fourth resistor;
  making a statement about the switching states of the first and the second switching element. The detected measured values of the respective voltage drops are compared to target values of the respective voltage drops with the corresponding switching states of the first and the second switching element.

A battery disconnect unit for disconnecting a battery system from an electrical system is also proposed. The battery disconnect unit comprises a first terminal, a second terminal, a first switching element and a second switching element. A first connection of the first switching element is connected to a first node point, and a second connection of the first switching element is connected to the first terminal. A first connection of the second switching element is connected to the first node point, and a second connection of the second switching element is connected to the second terminal.

The battery disconnect unit further comprises a diagnostic circuit proposed according to the invention. The second connection of the second resistor is connected to one of the second connection of the first switching element and of the second connection of the second switching element, and the second connection of the fourth resistor is connected to the other of the second connection of the first switching element and of the second connection of the second switching element.

Additionally or alternatively, the battery disconnect unit proposed according to the invention is configured to perform the method according to the invention.

Preferably, the battery disconnect unit further comprises a current sensing resistor connected between the first connection of the first switching element and the first node point or between the first node point and the first connection of the second switching element. In other words, the first connection of the first switching element or the first connection of the second switching element is connected to the first node point via the current sensing resistor. However, it is also conceivable that the current sensing resistor is connected between the first terminal and the second connection of the first switching element or between the second connection of the second switching element and the second terminal. In other words, in these cases, the first terminal is connected to the second connection of the first switching element via the current sensing resistor, or the second terminal is connected to the second connection of the second switching element via the current sensing resistor.

According to a preferred embodiment of the invention, the first switching element and the second switching element are designed as semiconductor switches. For example, the first and the second switching element may be designed as field effect transistors and respectively comprise a SOURCE connection, a DRAIN connection, and a GATE connection. The switching elements are connected such that in each case, the first connection is the SOURCE connection, the second connection is the DRAIN connection, and the third connection is the GATE connection. For example, the switching elements are MOSFETs, in particular n-channel enhancement-type MOSFETs. However, the first and the second switching element may also be designed as semiconductor switches of other types, such as IGBT.

Furthermore, a battery system comprising a battery disconnect unit according to the invention and/or configured to perform the method according to the invention is proposed.

The invention furthermore relates to a vehicle which comprises a battery disconnect unit according to the invention and/or a battery system according to the invention and/or is configured to perform the method according to the invention.

The invention provides a diagnostic circuit with a simple structure, which may be designed, for example, as an adapter for an already existing battery disconnect unit or may be integrated as an electronic circuit in the already existing battery disconnect unit.

With the method proposed according to the invention, a battery disconnect unit can be easily checked and a continuous check can thus be made possible. For example, the battery disconnect unit may be checked after a travel cycle or before switching on the battery system, and safety-related problems may thus be identified and solved earlier.

In the battery disconnect unit proposed according to the invention, a significantly smaller installation space is required. The battery disconnect unit proposed according to the invention is a largely independent system and can be offered in a very compact design. The battery disconnect unit proposed according to the invention can thus also be easily integrated into a user's own battery system.

BRIEF DESCRIPTION OF THE DRAWINGS

Embodiments of the invention are explained in more detail with reference to the drawings and the following description.

The FIGURE shows:

FIG. 1 a schematic illustration of a battery system with a battery disconnect unit according to the invention.

DETAILED DESCRIPTION

FIG. 1 shows a schematic illustration of a battery system 200 with a battery disconnect unit 100 according to the invention.

As shown in FIG. 1, a battery disconnect unit 100 proposed according to the invention is inserted into a battery system 200. The battery system 200 comprises a plurality of battery cells 5, which in the present case are connected in series to one another. The plurality of battery cells 5 may also be connected in parallel to one another. Preferably, a certain number of battery cells 5 may be combined to form a battery module or a battery pack. A plurality of battery modules or a plurality of battery packs may in turn be connected in series and/or in parallel.

The battery system 200 is connected to an electrical system 300, which can for example be designed as an on-board power supply of a vehicle or as a charger.

The battery disconnect unit 100 serves to disconnect the battery system 200 from the electrical system 300. The battery disconnect unit 100 also serves to connect the battery system 200 to the electrical system 300.

The battery disconnect unit 100 comprises a first terminal 2, a second terminal 4, a first switching element S1, a second switching element S2 and a current sensing resistor 6. The switching elements S1, S2 each have three connections, wherein a switching path is formed between a first connection and a second connection and can be actuated by means of a third connection.

The first switching element S1 and the second switching element S2 are in the present case designed as field effect transistors. The switching elements S1, S2 each comprise a SOURCE connection, a DRAIN connection and a GATE connection. The switching elements S1, S2 are connected such that in each case, the first connection is the SOURCE connection, the second connection is the DRAIN connection, and the third connection is the GATE connection.

In the present case, the switching elements S1, S2 are n-channel enhancement-type MOSFETs. The switching elements S1, S2 each comprise a switching path as well as an inverse diode connected in parallel to the switching path. The inverse diode, also referred to as the body diode, is produced in each MOSFET due to the internal structure thereof and is not an explicit component.

A first connection of the first switching element S1 is connected to a first node point 8, and a second connection of the first switching element S1 is connected to the first terminal 2. A first connection of the second switching element S2 is connected to the first node point 8 via the current sensing resistor 6, and a second connection of the second switching element S2 is connected to the second terminal 4.

The battery disconnect unit 100 further comprises a diagnostic circuit 60 proposed according to the invention. The diagnostic circuit 60 comprises a first voltage divider 61 comprising a first resistor R1, a second resistor R2 and a first protective diode D1, and a second voltage divider 62 comprising a third resistor R3, a fourth resistor R4 and a second protective diode D2.

In this case, the first resistor R1, the second resistor R2 and the first protective diode D1 are connected in series such that the anode of the first protective diode D1 is connected to a second node point 63, the cathode of the first protective diode D1 is connected to a first connection of the first resistor R1, a second connection of the first resistor R1 is connected to a first connection of the second resistor R2, and a second connection of the second resistor R2 is connected to the second connection of the first switching element S1.

The third resistor R3, the fourth resistor R4 and the second protective diode D2 are connected in series such that the anode of the second protective diode D2 is connected to a second node point 63, the cathode of the second protective diode D2 is connected to a first connection of the third resistor R3, a second connection of the third resistor R3 is connected to a first connection of the fourth resistor R4, and a second connection of the fourth resistor R4 is connected to the second connection of the second switching element S2.

The first and the second voltage divider 61, 62 may have an identical resistance ratio. For example, the first, the second, the third and the fourth resistor R1, R2, R3, R4 may have an identical resistance value.

Alternatively, a resistance ratio of the first voltage divider 61 may deviate from a resistance ratio of the second voltage divider 62.

The diagnostic circuit 60 further comprises a DC voltage source 64, which generates a DC voltage UE of, for example, 30 V or another value between the first and the second node point 8, 63 during diagnostics. In the present case, the DC voltage source 64 is designed as a battery cell. In this case, a positive pole of the DC voltage source 64 is connected to the second node point 63. A negative pole of the DC voltage source 64 is connected to the first node point 8.

Alternatively, the DC voltage source 64 may also be designed as a DC voltage transformer that can convert a DC voltage UE of an external DC voltage source from a different voltage level to a suitable voltage level for the diagnostics. However, a rectifier that converts an AC voltage into a DC voltage UE may also be regarded as a DC voltage source 64.

The battery system 200 further includes a contactor 20 for switching the battery system 200 on and off. The contactor 20 may be designed as a mechanical relay.

When performing the method according to the invention, a DC voltage UE is generated between the first and the second node point 8, 63 by the DC voltage source 64, while the first and the second switching element S1, S2 are in the open state.

A first measured value of the voltage drop UP1 is subsequently detected at the second resistor R2 by a first measurement channel not shown here.

Simultaneously or thereafter, a second measured value of the voltage drop UP2 is detected at the fourth resistor R4 by a second measurement channel not shown here.

A statement about the switching states of the first and the second switching element S1, S2 is subsequently made. The detected measured values of the respective voltage drops UP1, UP2 are compared to target values of the respective voltage drops UP1, UP2 with the corresponding switching states of the first and the second switching element S1, S2.

The invention is not limited to the exemplary embodiments described herein and the aspects highlighted therein. Rather, a variety of modifications, which are within the scope of activities of the person skilled in the art, is possible within the range specified by the claims.

The invention claimed is:

1. A diagnostic circuit for diagnosing a battery disconnect unit for disconnecting a battery system from an electrical system, the battery disconnect unit comprising:

a first terminal, a second terminal, a first switching element, and a second switching element, wherein a first connection of the first switching element is connected to a first node point,
a second connection of the first switching element is connected to the first terminal,
a first connection of the second switching element is connected to the first node point, and
a second connection of the second switching element is connected to the second terminal, wherein
the diagnostic circuit comprises a first voltage divider comprising a first resistor, a second resistor, and a first protective diode, and a second voltage divider comprising a third resistor, a fourth resistor, and a second protective diode, wherein
the first resistor, the second resistor, and the first protective diode are connected in series such that an anode of the first protective diode is connected directly to a second node point,
a cathode of the first protective diode is connected to a first connection of the first resistor,
a second connection of the first resistor is connected to a first connection of the second resistor, and
a second connection of the second resistor is connectable to one of the second connection of the first switching element and of the second connection of the second switching element, wherein
the third resistor, the fourth resistor, and the second protective diode are connected in series such that the anode of the second protective diode is connected directly to the second node point,
the cathode of the second protective diode is connected to a first connection of the third resistor,
a second connection of the third resistor is connected to a first connection of the fourth resistor, and
a second connection of the fourth resistor is connectable to another of the second connection of the first switching element and of the second connection of the second switching element,
wherein the first resistor, the second resistor, the third resistor, and the fourth resistor are separate resistors.

2. The diagnostic circuit according to claim 1, wherein the first and the second voltage divider have an identical resistance ratio.

3. The diagnostic circuit according to claim 1, wherein a resistance ratio of the first voltage divider deviates from a resistance ratio of the second voltage divider.

4. The diagnostic circuit according to claim 1, further comprising a DC voltage source that generates a DC voltage between the first and the second node point during diagnostics.

5. A method of diagnosing a battery disconnect unit for disconnecting a battery system from an electrical system by means of a diagnostic circuit having a first voltage divider including connected in series a first resistor, a second resistor, and a first protective diode such that an anode of the first protective diode is connected directly to a second node point, and a second voltage divider including connected in series a third resistor, a fourth resistor, and a second protective diode such that an anode of the second protective diode is connected directly to the second node point, wherein
the battery disconnect unit comprises a first terminal, a second terminal, a first switching element, and a second switching element, wherein
a first connection of the first switching element is connected to a first node point,
a second connection of the first switching element is connected to the first terminal,
a first connection of the second switching element is connected to the first node point, and
a second connection of the second switching element is connected to the second terminal,
wherein the method comprises the following steps:
connecting a second connection of the second resistor to one of the second connection of the first switching element and of the second connection of the second switching element;
connecting a second connection of the fourth resistor to another of the second connection of the first switching element and of the second connection of the second switching element;
generating a DC voltage between the first and the second node point by means of a DC voltage source, while the first and the second switching element are in an open state;
detecting a first measured value of a voltage drop at the second resistor;
detecting a second measured value of the voltage drop at the fourth resistor; and
outputting the switching states of the first and the second switching element,
wherein the first resistor, the second resistor, the third resistor, and the fourth resistor are separate resistors.

6. A battery disconnect unit for disconnecting a battery system from an electrical system, comprising a first terminal, a second terminal, a first switching element and a second switching element, wherein
a first connection of the first switching element is connected to a first node point,
a second connection of the first switching element is connected to the first terminal,
a first connection of the second switching element is connected to the first node point,
a second connection of the second switching element is connected to the second terminal, wherein
the battery disconnect unit further comprises a diagnostic circuit including a first voltage divider having connected in series a first resistor, a second resistor, and a first protective diode such that an anode of the first protective diode is connected directly to a second node point, and a second voltage divider having connected in series a third resistor, a fourth resistor, and a second protective diode such that an anode of the second protective diode is connected directly to the second node point, wherein
a second connection of the second resistor is connected to one of the second connection of the first switching element and of the second connection of the second switching element, and
a second connection of the fourth resistor is connected to another of the second connection of the first switching element and of the second connection of the second switching element,
wherein the first resistor, the second resistor, the third resistor, and the fourth resistor are separate resistors.

7. The battery disconnect unit according to claim 6, further comprising a current sensing resistor connected
between the first terminal and the second connection of the first switching element or
between the first connection of the first switching element and the first node point or
between the first node point and the first connection of the second switching element or
between the second connection of the second switching element and the second terminal.

8. The battery disconnect unit according to claim 6, wherein the first and the second switching element include a semiconductor switch.

9. A battery system comprising:
a battery disconnect unit including
a first terminal,
a second terminal,
a first switching element, and
a second switching element, wherein
a first connection of the first switching element is connected to a first node point,
a second connection of the first switching element is connected to the first terminal,
a first connection of the second switching element is connected to the first node point, and
a second connection of the second switching element is connected to the second terminal,
wherein the battery disconnect unit further comprises a diagnostic circuit including a first voltage divider having connected in series a first resistor, a second resistor, and a first protective diode such that an anode of the first protective diode is connected directly to a second node point, and a second voltage divider having connected in series a third resistor, a fourth resistor, and a second protective diode such that an anode of the second protective diode is connected directly to the second node point, wherein
a second connection of the second resistor is connected to one of the second connection of the first switching element and of the second connection of the second switching element, and
a second connection of the fourth resistor is connected to another of the second connection of the first switching element and of the second connection of the second switching element, and
a current sensing resistor connected between the first terminal and the second connection of the first switching element or between the first connection of the first switching element and the first node point or between the first node point and the first connection of the second switching element or between the second connection of the second switching element and the second terminal,
wherein the first resistor, the second resistor, the third resistor, and the fourth resistor are separate resistors.

10. A vehicle comprising a battery disconnect unit according to claim 6.

* * * * *